(12) United States Patent
Bowman

(10) Patent No.: US 7,310,049 B2
(45) Date of Patent: Dec. 18, 2007

(54) STATUS INDICATOR

(75) Inventor: Marc Bowman, McMinnville, OR (US)

(73) Assignee: Veris Industries, LLC, Portland, OR (US)

( * ) Notice: Subject to any disclaimer, the term of this patent is extended or adjusted under 35 U.S.C. 154(b) by 219 days.

(21) Appl. No.: 11/145,000

(22) Filed: Jun. 3, 2005

(65) Prior Publication Data

US 2006/0061480 A1    Mar. 23, 2006

Related U.S. Application Data

(60) Provisional application No. 60/611,967, filed on Sep. 21, 2004.

(51) Int. Cl.
*G08B 21/00* (2006.01)
*G01R 15/18* (2006.01)
*G01R 31/14* (2006.01)
*G01R 31/08* (2006.01)
*H02H 3/00* (2006.01)

(52) U.S. Cl. ............... 340/664; 340/635; 340/636.12; 340/636.13; 340/636.16; 340/641; 340/646; 340/660; 324/127; 324/133; 324/509; 324/512; 324/522; 361/63; 361/65; 361/79

(58) Field of Classification Search ............... 340/635, 340/650–664, 636.12, 636.13, 636.16, 641, 340/646, 660; 324/127, 133, 500, 537, 600, 324/509, 512, 522; 702/57–65; 361/63, 361/79
See application file for complete search history.

(56) References Cited

U.S. PATENT DOCUMENTS

| | | | |
|---|---|---|---|
| 2,411,405 A | 11/1946 | Yuhas | |
| 2,428,784 A | 10/1947 | Cole | |
| 2,512,070 A | 6/1950 | Nelson et al. | |
| 3,593,078 A | 7/1971 | Domshy et al. | |
| 3,728,705 A * | 4/1973 | Atkins | 340/642 |
| 3,769,548 A * | 10/1973 | Pardue | 361/45 |
| 3,976,924 A | 8/1976 | Vanjani | |
| 4,124,030 A | 11/1978 | Roberts | |
| 4,354,155 A * | 10/1982 | Speidel et al. | 324/133 |
| 4,574,266 A * | 3/1986 | Valentine | 340/635 |
| 4,709,339 A | 11/1987 | Fernandes | |
| 4,885,655 A | 12/1989 | Springer et al. | |
| 4,887,018 A | 12/1989 | Libert | |
| 4,890,318 A | 12/1989 | Crane et al. | |
| 4,991,050 A | 2/1991 | Heberlein, Jr. et al. | |
| 5,148,348 A | 9/1992 | White | |
| 5,311,138 A * | 5/1994 | Ott et al. | 324/503 |
| 5,359,273 A | 10/1994 | Fluckiger | |
| 5,430,438 A * | 7/1995 | Joos et al. | 340/3.9 |
| 5,444,183 A | 8/1995 | Gehrs et al. | |
| 5,578,927 A | 11/1996 | Perelle | |
| 5,784,249 A | 7/1998 | Pouliot | |
| 5,808,846 A | 9/1998 | Holce et al. | |
| 5,861,683 A | 1/1999 | Engel et al. | |
| 5,880,677 A | 3/1999 | Lestician | |
| 5,880,918 A * | 3/1999 | Horbelt et al. | 361/93.9 |
| 5,905,439 A * | 5/1999 | McIntyre | 340/664 |

(Continued)

Primary Examiner—Benjamin C. Lee
Assistant Examiner—Lam Pham
(74) Attorney, Agent, or Firm—Chernoff, Vilhauer, McClung & Stenzel LLP

(57) ABSTRACT

A status indicator indicates an operating state, including an electrical malfunction, of an electrical load that is located and controlled from locations remote from a monitoring location.

11 Claims, 3 Drawing Sheets

U.S. PATENT DOCUMENTS

| | | |
|---|---|---|
| 5,920,191 A * | 7/1999 | Maniero et al. ............ 324/133 |
| 5,995,911 A | 11/1999 | Hart |
| 6,005,760 A | 12/1999 | Holce et al. |
| 6,064,192 A | 5/2000 | Redmyer |
| 6,133,709 A | 10/2000 | Puchianu |
| 6,330,516 B1 | 12/2001 | Kammeter |
| 6,373,238 B2 | 4/2002 | Lewis et al. |
| 6,404,166 B1 | 6/2002 | Puchianu |
| D466,078 S | 11/2002 | Bowman |
| 6,724,600 B2 | 4/2004 | Holce et al. |
| 6,737,854 B2 | 5/2004 | Bruno et al. |
| 6,774,803 B1 * | 8/2004 | Tiffin ........................ 340/638 |
| 6,809,509 B2 | 10/2004 | Bruno et al. |
| 7,053,497 B2 * | 5/2006 | Sodemann et al. ......... 290/1 A |

* cited by examiner

STATUS INDICATOR

CROSS REFERENCE TO RELATED DOCUMENTS

The present application claims the benefit of U.S. Provisional Application No. 60/611,967, filed Sep. 21, 2004.

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

The present invention relates to a device for indicating the operating state of an electrical load and, more particularly, to a device for indicating an operating state of a load located and controlled at locations remote to a monitoring location.

Many industrial, commercial and residential environments incorporate electrical loads that are widely distributed geographically and often sited in difficult to access locations. However, the operation of these loads, for example, small fan motors or lights can be important to maintaining a safe environment or the successful completion of a process that may involve costly or hazardous equipment or materials and monitoring their operation is frequently desired.

In many applications, the operation of a remotely located electrical load is monitored and controlled from a central control. FIG. 1 illustrates a typical arrangement for controlling and monitoring the operation a remote load from a central controller. A remote control and status monitoring device 10 includes a start/stop relay 12 that is energized or otherwise controlled by digital output from the controller 14. Power from a power source 16, such as a utility transmission line, is provided by a wire 18 which is interconnected to the start/stop relay 12 of the device 10. The start/stop relay 12 is likewise interconnected to an internal sensor, namely, a current transformer 20 by a wire 22. The output of the internal sensor 20 is interconnected to a load 24 by a wire 26. The load 24 is interconnected to the source 16 by a wire 52. Accordingly, a loop for current flow is provided by wire 18, the start/stop relay 12, the wire 22, the internal sensor 20, the wire 26, and the wire 52. When the start/stop relay 12 is open, as a result of a first DIGITAL OUT signal from the controller 14, the power to the load 24 is interrupted by the open circuit. However, when the start/stop relay 12 is closed (short circuit), as a result of a second DIGITAL OUT signal from the controller 14, power is provided to the load 24. Accordingly, the controller 14 may control power to the load 24 by energizing and de-energizing the start/stop relay 12. The device 10 also provides a feedback signal to the controller 14 indicating whether current is flowing to the load. The internal sensor 20 is a current transformer that senses current flowing in wire 22 and outputs a signal to operate a solid state switch 21. The solid state switch 21 opens or closes providing a signal (DIGITAL IN) to the controller 14 in response to a flow of current to the load. The controller 14 can determine the operating condition of the load from the combination of the DIGITAL IN signal indicating whether current is flowing to the load and the DIGITAL OUT signal generated by the controller 14 indicating whether or not a closed load circuit should be expected and, therefore, whether current should be flowing to the load.

While the remote control and status monitoring device illustrated in FIG. 1 provides satisfactory monitoring of the operational status of a centrally controlled, remotely located load, in many environments it is desired to monitor the status of a remotely located load that is controlled from a location. that is remote from the monitoring location. For example, building security may desire to know whether lights controlled from a light switch on a remote floor or in a remote room are operating properly. Likewise, a person monitoring geographically distributed industrial machinery may desire to know the operating status of a cooling fan that is mounted on an machine located in a remote or inaccessible portion of an industrial facility and which is controlled by a local thermostat. While the output of a current sensor, such as the internal sensor of the remote control and status monitoring device 10, can be used to indicate whether current is flowing to a remote load, the information provide by a current sensor is insufficient to determine whether the load is malfunctioning because there is no information indicating whether the load circuit is closed and, therefore, current flow to the load should be expected. The operating state of a remotely controlled light in a remote room or a cooling fan for a remotely located machine requires knowledge of the state of the load controlling switch as well as knowledge of the current flow to the load.

What is desired, therefore, is a device for signaling the operating state of an electrical load located and controlled at locations remote to the monitoring location.

DETAILED DESCRIPTION OF THE INVENTION

Figure 1:
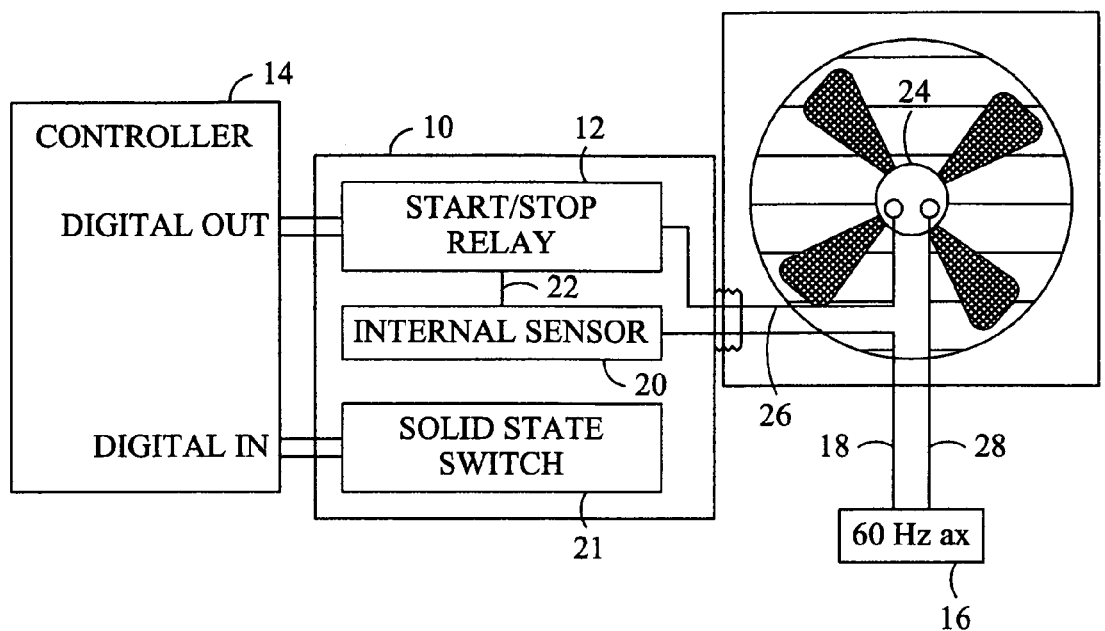
FIG. 1 is a block diagram of a combination current sensor and relay device operated and monitored by a controller that controls the operation of a remote fan motor.

In many environments electrical loads that are widely distributed geographically are controlled and monitored from a central location. FIG. 1 illustrates a circuit and a device enabling controlling and monitoring the operation of a remote load 24 from a central controller 14. A remote control and status monitoring device 10 includes a start/stop relay 12 that is energized or otherwise controlled by digital output from the controller 14. Power from a power source 16, such as a utility transmission line, is provided by a wire 18 which is interconnected to the start/stop relay 12 of the device 10. The start/stop relay 12 is likewise interconnected to an internal sensor, namely, a current transformer 20 by a wire 22. The output of the internal sensor 20 is interconnected to a load 24 by a wire 26. The load 24 is interconnected to the source 16 by a wire 52. Accordingly, a loop for current flow is provided by wire 18, the start/stop relay 12, the wire 22, the internal sensor 20, the wire 26, and the wire 52. When the start/stop relay 12 is open, as a result of a first DIGITAL OUT signal from the controller 14, the power to the load 24 is interrupted by the open circuit. However, when the start/stop relay 12 is closed (short circuit), as a result of a second DIGITAL OUT signal from the controller 14, power is provided to the load 24. Accordingly, the controller 14 may control power to the load 24 by energizing and de-energizing the start/stop relay 12. The device 10 also provides a feedback signal to the controller 14 indicating whether current is flowing to the load. The internal sensor 20, comprising a current transformer that senses the current level to the load 24 and outputs a signal to operate a solid state switch 21. The solid state switch 21 opens or closes providing a DIGITAL IN signal to the controller 14 that is responsive to the amount of current flowing in wire 22. The controller 14 can determine the operating status to the load from the DIGITAL IN signal indicating whether current is flowing to the load and the DIGITAL OUT signal, generated by the controller 14, indicating whether or not a closed load circuit should be expected and, therefore, whether a current should be flowing to the load.

However, in many other instances the operation of a remotely located load is controlled by a device that is remote from the location where the operation of the load is to be monitored. For example, the lights of a commercial building are typically controlled by switches, photo-detectors, or motion sensors located on the floor or in the room where the light is located. For safety or other reasons, the building's security or maintenance personnel may desire to monitor the operation of the building's lights from a central location. Likewise, an operator of an industrial process may desire to monitor the operation of a number of widely distributed machines, including a cooling fan located in a cabinet on a remote machine and controlled by a thermostatic sensor in the cabinet. While the monitoring device illustrated in FIG. 1 provides satisfactory monitoring of the operational status of a centrally controlled, remotely located load, the output of the current sensor provides insufficient information to determine whether a remotely located, remotely controlled load is malfunctioning. In addition to knowledge of the state of current flow in the load circuit, determining whether or not a load is functioning when its operation is expected requires knowledge of the open or closed state of the load circuit.

The state of the switch controlling the operation of a load can be signaled to a remotely located monitoring station, but the additional wiring and circuit complexity often makes monitoring the state of the switch impractical. For example, a second set of contacts in the load controlling switch could be used to signal an open or closed load circuit to a remote monitoring location. However, the cost of the wiring to connect a second set of switch contacts to a remote monitoring location would be prohibitively expensive in many instances. The present inventor concluded that a status indicator signaling the combined state of the voltage and the current at the load terminals could economically provide an accurate indication of the operating state of a load to a remote monitoring location.

Figure 2:
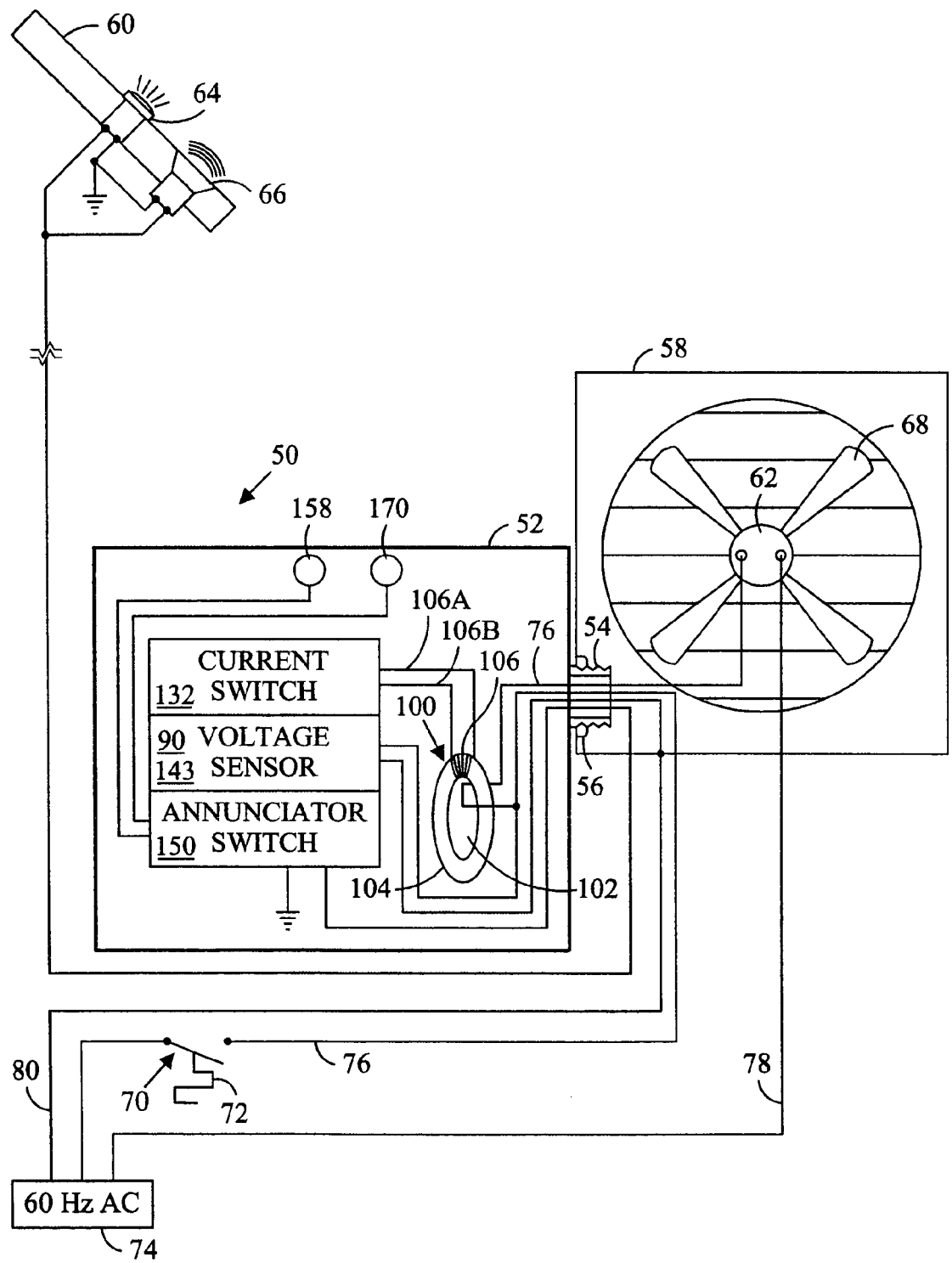
FIG. 2 is a block diagram of a status indicator for monitoring the operating state of load located and controlled at locations remote from a monitoring location.

Referring in detail to the drawings where similar parts of the invention are identified by like reference numerals and referring in particular to FIG. 2, an exemplary status indicator 50 comprises generally a current sensor 100, a current switch 132, a voltage sensor 143, and an annunciator switch 150 that are preferably confined to a single enclosure 52. The enclosure 52 includes a threaded protrusion 54 sized for insertion into an aperture in a housing of an electrical device or a knock-out aperture of an electrical junction box. Wires connecting the internal circuitry of the status indicator 50 to an electrical circuit can be routed through aperture in the annular threaded portion 54. The enclosure 52 can be conveniently retained to a housing of the load or an electrical junction box by a nut 56 that engages the threaded protrusion 54 on the opposite side of the wall of the housing 58 or junction box from the body of the enclosure 52. By locating the current sensor, voltage sensor, and annunciator switch proximate to one another, within a single enclosure, it is considerably easier to locate the status indicator 50 for convenient connection to the conductors connecting the load to a power source. Additionally, installing a status indicator 50 comprising a single unit requires less installation time than that required for separate devices. The expense of manufacturing, packaging and shipping a single device is also less than the expense of several devices. A reduction in the number of backup parts and troubleshooting time is also realized.

The status indicator 50 provides an annunciator signal to a remotely located monitoring panel 60 indicating the operating state of an electrical load 62. Annunciator signals produced by the status indicator 50 may be used to illuminate one or more lights 64, operate an audio device 66, or otherwise signal a person or device monitoring the operation of a load that load is inoperative, electrically operative, or malfunctioning.

The load 62 illustrated in FIG. 2, is an electric motor driving a fan 68. However, the load could be any electrical device through which current flows when a voltage is applied. For example, the load could be a light, a horn, a solenoid, etc. The operation of the fan motor is controlled by a thermostatic switch 70 that is often located near the load and is located remote from the monitoring panel. The load controlling switch could be a manually operated switch, a relay, a power transistor, or another known switching device. Moreover, the load controlling switch could be part of a controller, such as a programmable logic controller, or other device controlling a plurality of loads from a location remote from the location where the operation of the load is monitored. When the terminals of the load controlling switch 70 are shorted by operation of the thermostatic element 72, a circuit is closed from a power source 74, for example, a connection to a utility transmission line, through a wire 76 to the load 62 and back to the power source through a wire 78. A neutral conductor 120 from the power source 74 is connected to the fan housing 58 and the voltage sensor 90 of the status indicator 50.

The wire 76 enters the enclosure 52 through the aperture in the annular protrusion 54 and is wrapped around the section of the toroidal core 104 of a current transformer 100 and through the central aperture 102 of the core. The current transformer 100 is preferably a wire-wrapped magnetically permeable toroidal core 104, normally made of iron, encircling a cable or wire through which current flows to the load. Changing current in the wire 76 induces a changing electromagnetic field around the wire, which in turn induces a magnetic flux in the magnetically permeable core 104 of the current transformer 100. The magnetic flux in the core 104, in turn, induces a voltage or transformer signal in the wire windings 106 around the section of the toroidal core. Thus, the wire winding 106 of the current transformer 100 is the secondary winding of the transformer, while the wire 76, or a parallel shunt current divider (not shown), is the primary winding of the sensing transformer 100 and the voltage or transformer signal induced in the wire winding is representative of the current flowing in the primary winding, wire 76.

A current transformer with a core of magnetically permeable material, such as iron, generates a secondary winding voltage signal reasonably accurately representative of the current in the primary winding over a certain normal load range. However, iron and other magnetically permeable materials have hysteresis and other nonlinear responses to changing magnetic fields that result in a nonlinear relationship between current in the power cable and the voltage signal produced in a transformer coil having such a core. The nonlinearity of such responses is especially significant with large variations in load current and frequency. To provide a more linear measurement of power, "air core" transformers have been designed using wire wrapped on a core made of material having a low magnetic permeability, such as one of plastic or nylon. Without a magnetically permeable core, however, the transformer winding generates relatively small voltage levels in response to power cable currents. Examples of circuitry suitable for use with an "air core" transformer are disclosed in U.S. Pat. No. 5,502,374, assigned to the assignee of the current application, and incorporated herein by reference.

Figure 3:
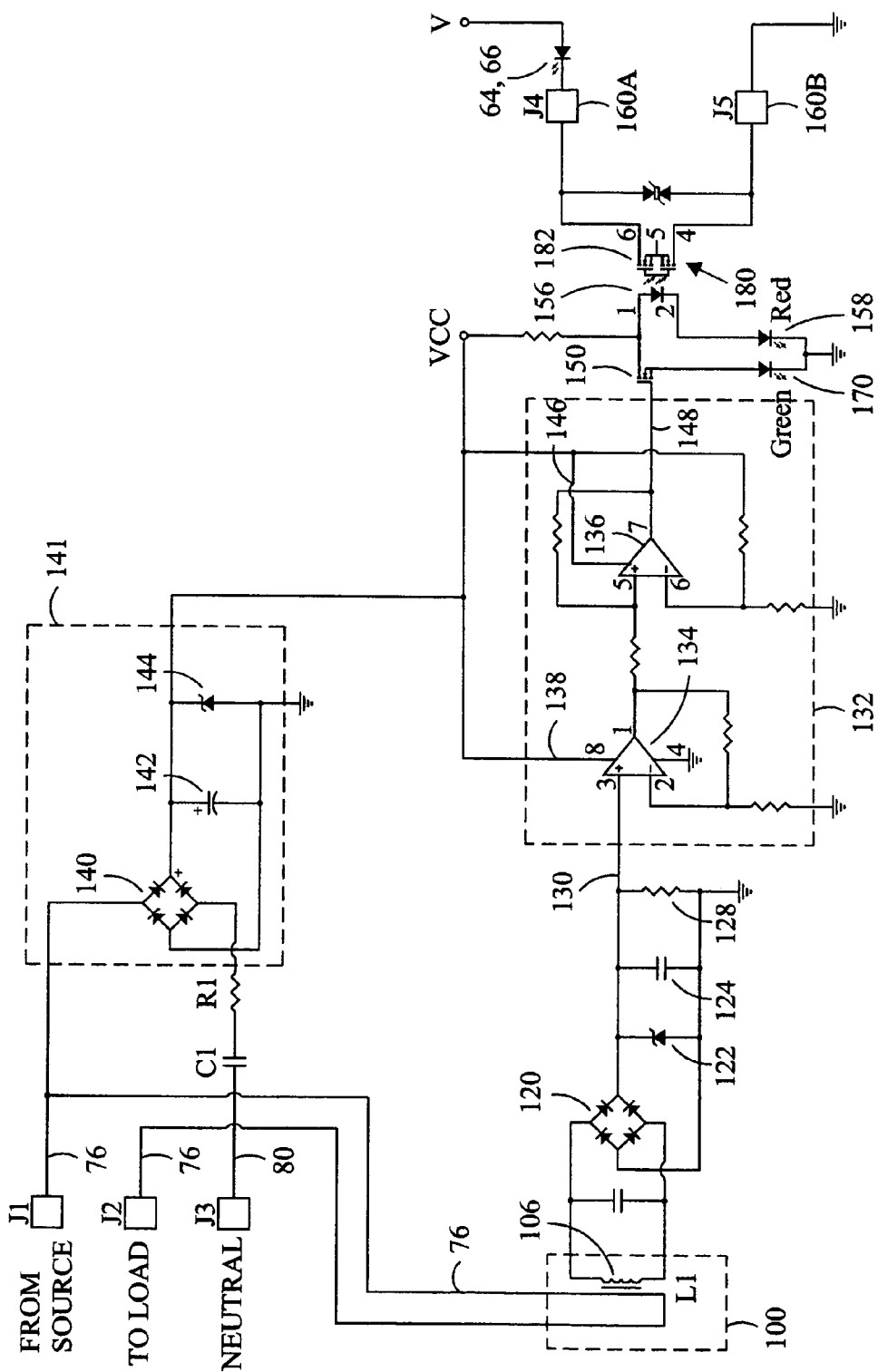
FIG. 3 is a circuit diagram of an exemplary status indicator for remote monitoring of the operating state of a load.

Referring also to FIG. 3, in the indicator 50 the ends 106a, 106b of the secondary winding 106 of the sensing transformer 100 are connected to the input terminals of a full wave rectifier 120. A zener diode 122, a capacitor 124, and a resistor 126 in parallel with the output of the full wave rectifier 120 controls the voltage output by the rectifier. The exemplary current switch 132 is an active device comprising dual operational amplifiers 134, 136. When a voltage is applied to a supply voltage input 138 of an operational amplifier, the output of the amplifier is responsive to the voltage applied to the amplifier input. The voltage applied to the amplifier input 130 or amplifier 134 of the current switch 132 is representative of the amount of current flowing in wire 76 connecting the source 74 and the load 62.

In the current switch 132, the voltage in wire 76 connecting the source 74 and the load 62 also provides the supply voltage to the amplifiers 134, 136. The wire 76 is connected to one terminal of a second full wave rectifier 140. The second terminal of the rectifier 140 is connected to the neutral conductor 80 of the three wire connection to the source 74. The output of the rectifier 140 is filtered and controlled by a parallel capacitor 142 and a diode 144 and is connected to the supply voltage terminals 138, 146 of the amplifiers 134, 136, respectively, and the drain 152 of a MOSFET transistor annunciator switch 150. The output 148 of the current switch 132 is responsive to the voltage applied to the supply voltage inputs 138, 146 of the amplifiers 134, 136 and the voltage applied to the amplifier input 130. Since the voltages applied to the supply voltage inputs 138, 146 and the amplifier input 130 of the current switch 132 are responsive, respectively, to the voltage and the amount of current in the wire 76, the output 148 of the current switch is responsive to the voltage and current in the wire conducting power from the power source 74 to the load 62.

The output 148 of the current switch 132 supplies a gate signal to the annunciator switch 150. The annunciator switch 150 controls the operation of at least one annunciator signaling the operating state of the load 62. When the annunciator switch 150 is in a non-conducting state, current flows through an LED 156 of an optical coupler 154 to a first status indicating LED 158 causing the two series LEDs to illuminate. Illumination of the LED 156 causes the phototransistors 182 of the optical coupler 154 to switch to a conducting state closing the circuit between the terminals 160a and 160b. The terminals 160a and 160b are connected to control operation of at least one additional annunciator. In the exemplary circuit, the shorting of terminals 160a and 160b closes a circuit between the ground 190 and a panel light 64 and a speaker 66 located on a remote monitoring panel 60. On the other hand, when the annunciator switch 150 is in a conducting state, current does not flow through the LED 156 of the optical coupler 180 and the first status illuminating LED 158, but current flows through the annunciator switch to illuminate a second status indicating LED 170. While the status indicating LEDs 158, 170 of the exemplary indicator 50 are located in the wall of the enclosure 52 of the indicator, the status indicating LEDs could be remotely mounted, for example, on the monitoring panel 60, if it is desired to provide an indication of proper operation of the load 62, as well as an alarm indicating malfunction of the load. Since the LED 156 is not illuminated when the annunciator switch 150 is conducting, the phototransistors 182 of the optical coupler 180 do not conduct. As a result, the circuit between terminals 160a and 160b is open and the additional annunciator(s), panel light 64 and speaker 66 are inoperative.

When the terminals of the load controlling switch 70 are open, the wire 76 and the wire 80 are at the same potential and no current is flowing in wire 76. As a result, no voltage is applied to the drain 152 of the annunciator switch 150 and no current flows through either of the status indicating LEDs 158, 170 or the LED 156 of the optical coupler 180. The phototransistor 182 of the optical coupler 180 is non-conducting and the second annunciator 64, 66 is also inoperative. The absence of illumination of the status indicating LEDs 158, 178 can be used to signal that the load 62 is not operating.

When the load controlling switch 70 is closed, a voltage between the power wire 76 and the neutral wire 80 is applied to the terminals of the second rectifier 146. As a result, a supply voltage is applied to the amplifiers 134, 136 of the current switch 132 and to the drain 152 of the annunciator switch 150. If current exceeding a threshold current flows in the wire 76, indicating an operating load 62, a voltage is induced in the secondary winding 106 of the current transformer 100 and a voltage, output by the first rectifier 146, is applied to the amplifier input 130. With the application of a voltage to supply voltage inputs 138, 146 of the operational amplifiers 134, 136 and the application of a transformer signal voltage to the amplifier input 130 of the current switch 132, a voltage develops at the output 148 of the current switch biasing the annunciator switch 150 and closing the circuit to the illuminate the second status indicating LED 170, signaling that the load is operating.

However, if the current flowing in the wire 76 is less than the threshold current, the secondary winding 106 of the current transformer 100 will develop an insufficient transformer signal voltage at the amplifier input 130 to produce a voltage at the output 148 of the current switch 132 that sufficient to bias the annunciator switch 150 so as to enable current to flow through the annunciator switch. Current will flow from the drain 152 of the annunciator switch which is conductively connected to the output of the second rectifier 140 and through the LED 156 of the optical coupler 180 to illuminate the first status indicating LED 158, indicating a malfunction of the load. Illumination of the LED 156 of the optical coupler 180 will cause shorting of the terminals 160a and 160b and cause the additional annunciator, for examples, the panel mounted light 64 or speaker 66, to become operative alerting the system monitor of the malfunction.

The status indicator indicates the operating state, including an electrical malfunction, of a remotely controlled electrical load to a monitoring station that is remote from the load.

The detailed description, above, sets forth numerous specific details to provide a thorough understanding of the present invention. However, those skilled in the art will appreciate that the present invention may be practiced without these specific details. In other instances, well known methods, procedures, components, and circuitry have not been described in detail to avoid obscuring the present invention.

All the references cited herein are incorporated by reference.

The terms and expressions that have been employed in the foregoing specification are used as terms of description and not of limitation, and there is no intention, in the use of such terms and expressions, of excluding equivalents of the features shown and described or portions thereof, it being recognized that the scope of the invention is defined and limited only by the claims that follow.

The invention claimed is:

1. An indicator to signal an operating state of a load, said indicator comprising:
    (a) an amplifier having a supply voltage responsive to a voltage applied to said load, an amplifier input responsive to a flow of current to said load, and an output, said output having:
        a first value when said supply voltage is present and said flow of current to said load exceeds a threshold flow; and
        second value when said supply voltage is present and said current to said load does not exceed said threshold flow; and
    (b) a transducer indicating, alternatively:
        (i) a first operating state of said load if said first value is output;
        (ii) a second operating state of said load if said second value is output; and
        (iii) a third operating state of said load if said voltage is not applied to said load.

2. The indicator of claim 1 wherein said amplifier input responsive to a flow of current to said load comprises a voltage induced in a secondary winding of a current transformer by a flow of current in a primary winding, said primary winding comprising a conductor of current from a source to said load.

3. The indicator of claim 1 further comprising:
    (a) a status annunciator producing a signal in response to conduction between a pair of annunciator inputs; and
    (b) a switch responsive to said second value of said amplifier output to short said annunciator inputs and responsive to said first value of said amplifier output to open a conductive path between said annunciator inputs.

4. The indicator of claim 1 further comprising a first status annunciator producing a first operating state signal in response to said first value of said amplifier output and a second status annunciator producing a second operating state signal in response to said second value of said amplifier output.

5. An indicator to signal an operating state of a load, said indicator comprising:
    (a) a current transformer including a primary winding comprising a conductor connected to supply current to a load and a secondary winding magnetically coupled to said primary winding so that a flow of current in said primary winding will induce a voltage in said secondary winding;
    (b) an amplifier having an output responsive to an amplifier input and a supply voltage, said amplifier input responsive to said voltage in said secondary winding of said current transformer and said supply voltage responsive to a voltage of said primary winding;
    (c) a first annunciator signaling a first operating state of said load in response to connection of said first annunciator to said supply voltage;
    (d) a second annunciator signaling a second operating state of said load in response to disconnection of said first annunciator from said supply voltage; and
    (e) an annunciator switch responsive to said amplifier output to connect first annunciator to said supply voltage.

6. The indicator of claim 5 further comprising a third annunciator responsive to current flow to said second annunciator to signal said second operating state of said load.

7. A method of signaling an operating state of a load, said method comprising the steps of:
    (a) generating an amplifier input voltage representative of an amount of current flowing to said load;
    (b) applying a voltage responsive to a load voltage to a supply voltage input of an amplifier;
    (c) applying said amplifier input voltage to an amplifier input of said amplifier, said amplifier producing an amplifier output when said amplifier input voltage is applied to said amplifier input and said voltage is applied to said supply voltage input;
    (d) signaling a first operating state of said load if said load voltage is applied to said load and said amplifier output is less than a threshold output;
    (e) signaling a second operating state of said load if said amplifier output exceeds said threshold output; and
    (f) signaling a third operating state of said load if said load voltage is not applied to said load.

8. The method of signaling an operating state of a load of claim 7 wherein the step of generating an amplifier input voltage representative of an amount of current flowing to said load comprises the steps of:
    (a) connecting a secondary winding of a current transformer to an amplifier input; and
    (b) magnetically coupling a conductor of current to said load to said secondary winding of said current transformer.

9. The method of signaling an operating state of a load of claim 7 wherein the step of signaling said first operating state of said load if said amplifier output is less than a threshold output comprises the step of disconnecting one of a first annunciator and a second annunciator from a voltage source if said amplifier output is less than said threshold output.

10. The method of signaling an operating state of a load of claim 7 wherein the step of signaling said second operating state of said load if said amplifier output exceeds a threshold output comprises the step of connecting an annunciator to a voltage source responsive to said load voltage.

11. The method of signaling an operating state of a load of claim 7 wherein the step of signaling said third operating state of said load comprises the step of connecting at least one annunciator to a voltage source responsive to said load voltage.

* * * * *

UNITED STATES PATENT AND TRADEMARK OFFICE
CERTIFICATE OF CORRECTION

PATENT NO. : 7,310,049 B2  Page 1 of 1
APPLICATION NO. : 11/145000
DATED : December 18, 2007
INVENTOR(S) : Marc Bowman It is certified that error appears in the above-identified patent and that said Letters Patent is hereby corrected as shown below:

Col. 2, line 8-9
Change "controlled from a location. That is remote" to --controlled from a location that is remote--.

Col. 2, line 14-15
Change "mounted on an machine" to --mounted on a machine--.

Col. 2, line 20
Change "the information provide" to --the information provided--.

Col. 2, line 39
Change "operating state of load located" to --operating state of loads located--.

Col. 6, line 41
Change "circuit to the illuminate" to --circuit to illuminate--.

Col. 6, line 47-48
Change "that sufficient to bias" to --that is sufficient to bias--.

Col. 7, line 34-35
Change "input responsive" to --input is responsive--.

Signed and Sealed this

Twentieth Day of May, 2008

JON W. DUDAS
*Director of the United States Patent and Trademark Office*